United States Patent [19]

Tsuji

[11] 4,366,117
[45] Dec. 28, 1982

[54] COPPER ALLOY FOR USE AS LEAD MATERIAL FOR SEMICONDUCTOR DEVICES

[75] Inventor: Masahiro Tsuji, Urawa, Japan

[73] Assignee: Nikon Kogyo Kabushiki Kaisha, Tokyo, Japan

[21] Appl. No.: 270,064

[22] Filed: Jun. 3, 1981

[30] Foreign Application Priority Data

Jun. 6, 1980 [JP] Japan ................... 55/75575

[51] Int. Cl.³ ............................. C22C 9/04
[52] U.S. Cl. .................... 420/481; 420/490
[58] Field of Search ................. 75/157.5, 159

[56] References Cited

U.S. PATENT DOCUMENTS

| | | | |
|---|---|---|---|
| 2,027,330 | 1/1936 | Wilkins | 75/159 |
| 2,028,317 | 1/1936 | Buttesbaugh | 75/157.5 |
| 2,137,282 | 11/1938 | Hensel et al. | 75/159 |
| 2,309,100 | 1/1943 | Crampton et al. | 75/157.5 |
| 3,072,508 | 1/1963 | Klement et al. | 75/159 |
| 3,926,681 | 12/1975 | Wang | 75/195 |
| 4,015,982 | 4/1977 | Saito et al. | 75/157.5 |

*Primary Examiner*—Peter K. Skiff
*Attorney, Agent, or Firm*—Seidel, Gonda, Goldhammer & Panitch

[57] ABSTRACT

A copper alloy for use as a lead material for semiconductor devices, which comprises 0.04–1.0% Ni, 0.01–0.3% Si, and 0.05–15% Zn, all by weight, and the remainder Cu and inevitable impurities. The alloy may contain, in addition to these, a total amount of 0.001–1.0% by weight of one or two or more elements as an accessory ingredient or ingredients selected from the group consisting of 0.001–0.1% by weight each of P and As and 0.01–0.5% by weight each of Ti, Cr, Sn, Mn, and Mg.

3 Claims, No Drawings

COPPER ALLOY FOR USE AS LEAD MATERIAL FOR SEMICONDUCTOR DEVICES

BACKGROUND OF THE INVENTION

This invention relates to a copper alloy suited for use as a lead material for semiconductor devices, such as transistors and integrated circuits (IC).

Heretofore, high nickel alloys, e.g., Kovar (Fe-29Ni-16Co) and 42 alloy (Fe-42Ni), have been adopted by preference as lead materials for semiconductor devices, because of their low thermal expansion coefficients and good bonding and sealing properties when joined to the semiconductive elements and moldings. In recent years, with the development of semiconductor circuits with increased degrees of integration, there has been a growth in the percentage of IC's of high power consumption types employed. Accordingly, lead materials made of the copper-base alloys that rapidly dissipate heat or exhibit good thermal conductivity have found usage. Today, such copper-base alloys as oxygen-free copper, phosphor bronze, tin brass, and red brass are in use. However, none of those copper-base alloys have been found to possess all the varied properties required as a lead material, i.e., good heat dissipation, thermal resistance, solderability, plating adhesion, repeated bending strength, and inexpensiveness.

For example, oxygen-free copper is of highly heat-dissipating ability but its heat resistance and strengths are insufficient. Phosphor bronze has outstanding strength but is costly and is itself a poor heat radiator. Tin brass is yet to be improved in heat resistance, although the other properties are excellent. Since it uses the expensive tin as the addition element, the adoption of some other less expensive alloys instead is being called for. Red brass is available at low cost and is useful as a multipurpose material but has a disadvantage of low heat resistance. With the merits and demerits the conventional copper-base alloys have not necessarily been satisfactory from the overall viewpoint for the applications as lead materials.

BRIEF SUMMARY OF THE INVENTION

In view of the above, the present invention aims at remedying the shortcomings of the existing copper-base alloys and providing a copper-base alloy which is obtained at low cost and yet possesses varied properties desirable as a lead material for semiconductor devices.

The copper alloy according to the invention is either an alloy for use as a lead material for semiconductor devices, which comprises 0.04–1.0%, preferably 0.08–1.0% Ni, 0.01–0.3%, preferably 0.02–0.24% Si, and 0.05–15%, preferably 0.1–12.0% Zn, all by weight, and the remainder Cu and inevitably concomitant impurities. This invention further provides a copper alloy for similar application comprising, in addition to Ni, Si, and Zn in the proportions specified above, 0.001–1.0% by weight in a total amount of one or two or more elements as an accessory ingredient or ingredients selected from the group consisting of 0.001–0.1% by weight each of P and As, 0.01–0.5% by weight each of Ti, Cr, Sn, Mn, and Mg, and the remainder Cu and inevitable impurities.

DISCLOSURE OF THE INVENTION

Next, the reasons for which the alloying elements to constitute the alloy of the invention are chosen and for which their compositional proportions are confined within the specified ranges will be explained.

The Ni content is specified to be in the range of 0.04–1.0% by weight, because with less than 0.04% Ni the resulting alloy will not attain the heat resistance as expected, even by the addition of up to 0.3% Si. Conversely if the Ni content exceeds 1.0%, the alloy will have an inadequate electric conductivity and will become too costly. Preferably, the Ni content is ranged 0.08–1.0%.

The Si range of 0.01–0.3% by weight is chosen because the content of less than 0.01% will not give the desired heat resistance even when Ni is added up to 1.0% by weight and more than 0.3% will unfavorably lower the electric conductivity of the alloy. It is preferable to choose Si concent of 0.02–0.24%.

The Zn content may range from 0.05% to as much as 15% by weight. Zn improves the mechanical properties of the resulting alloy, and a larger amount of Zn addition is advisable for the reduction of the alloy-making cost. However, with less than 0.05% Zn content the effect of strength increase is small while on the other hand Zn in excess of 15% will lower the electric conductivity too far and will sharply increase the susceptibility of the alloy to stress corrosion cracking. Particularly, the Zn content of 0.1–12.0% is preferable.

In case where one or more selected from a group of P, As, Ti, Cr, Mn and Mg as accessory ingredients is added, the combined total proportion thereof is restricted within the range of 0.001–1.0% by weight. This is because those ingredients, which all improve the strengths and heat resistance of the resulting alloy, will not prove so effective if the total proportion is below 0.001%. On the contrary, the proportion over 1.0% will seriously decrease the electric conductivity and affect the workability of the alloy.

Desirable plating adhesion and solderability also are attained by the alloy containing Ni, Si, Zn and the accessory ingredients in the ranges specified above.

The process for producing the alloy of the invention is not dissimilar to those usually used in making copper-base alloys. Following the final cold working, the alloy of the invention may be subjected to a low-temperature heat treatment, tension annealing, or other desired heat treatment so that it can have added strengths and heat resistance as compared with a simply cold worked product.

EXAMPLE

Alloy ingots of varied compositions according to the invention as shown in Table 1 were made by high-frequency induction melting in air atmospheric, hot rolled at 800° C. to plates 4 mm in thickness. The plates were cold rolled to 1 mm-thick sheets, and the sheets were annealed at 500° C. for one hour and further cold rolled to 0.6 mm-thick sheets. Test pieces of the sheets prepared thus were tested. For the evaluations, the physical strength was determined by a tensile test, heat resistance was determined by measuring the temperature at which each test piece began to soften after 30 minutes of heating, and electric conductivity and heat dissipation rate was indicated in terms of electric conductivity (%IACS). The electric conductivity and heat dissipation rate are in a proportional relation to each other and accordingly may be evaluated by the electric conductivity. The test results are given, together with those of reference alloys prepared and evaluated in the same way, in Table 1.

As can be seen from Table 1, the alloy of the invention combines adequate strength and heat resistance with good electric conductivity. The use of the alloy according to the invention as a lead material will render it possible to manufacture semiconductor devices of low cost and high reliability.

TABLE 1

| Alloy test piece | Alloy composition (wt %) | | | | Cu | tensile strength (kg/mm$^2$) | softening temperature (°C.) | electric conductivity (% IACS) | Remarks |
|---|---|---|---|---|---|---|---|---|---|
| | Ni | Si | Zn | Accessory ingredient | | | | | |
| Invention: | | | | | | | | | |
| (1) | 0.08 | 0.02 | 0.1 | — | bal. | 37.1 | 350 | 90 | |
| (2) | 0.2 | 0.05 | 0.5 | — | " | 40.8 | 350 | 71 | |
| (3) | 0.5 | 0.1 | 1.0 | — | " | 41.3 | 350 | 56 | |
| (4) | 0.8 | 0.2 | 9.6 | — | " | 52.5 | 375 | 27 | |
| (5) | 0.5 | 0.05 | 5.0 | 0.01 P | " | 48.2 | 450 | 39 | |
| (6) | 0.5 | 0.05 | 5.0 | 0.005 As, 0.05 Sn | " | 47.6 | 425 | 40 | |
| (7) | 0.5 | 0.05 | 5.0 | 0.03 Ti, 0.01 Cr, 0.05 Mg | " | 48.3 | 425 | 36 | |
| (8) | 0.5 | 0.05 | 5.0 | 0.01 P, 0.1 Mn | " | 49.1 | 450 | 38 | |
| (9) | 1.0 | 0.24 | 12.0 | — | " | 66.5 | 400 | 24 | |
| Reference: | | | | | | | | | |
| (1) | — | — | — | — | " | 35.9 | 200 | 102 | Oxygen-free copper |
| (2) | — | — | — | 0.1 Sn | " | 36.5 | 350 | 93 | Tin brass |
| (3) | — | — | — | 5.0 Sn, 0.2 P | " | 52.0 | 325 | 15 | Phosphor bronze |
| (4) | — | — | 15.0 | — | " | 53.6 | 300 | 35 | Red brass |

What is claimed is:

1. A copper alloy for use as a lead material for semiconductor devices consisting of:
   between about 0.04 and about 1.0 weight percent of Ni,
   between about 0.01 and about 0.3 weight percent of Si,
   between about 0.05 and about 15 weight percent of Zn, and
   the remainder Cu and inevitable impurities.

2. A copper alloy for use as a lead material for semiconductor devices consisting essentially of:
   (a) between about 0.04 and about 1.0 weight percent of Ni,
   (b) between about 0.01 and about 0.3 weight percent of Si,
   (c) between about 0.05 and about 15 weight percent of Zn,
   (d) an accessory ingredient or ingredients selected from the group consisting of
   between about 0.001 and about 0.1 weight percent of P,
   between about 0.001 and about 0.1 weight percent of As,
   between about 0.01 and about 0.5 weight percent of Ti,
   between about 0.01 and about 0.5 weight percent of Cr,
   between about 0.01 and about 0.05 weight percent of Sn,
   between about 0.01 and about 0.5 weight percent of Mn,
   between about 0.01 and about 0.5 weight percent of Mg,
   the total weight of said accessory ingredient or ingredients being between about 0.001 and about 1.0 weight percent of the alloy, and
   (e) the remainder of the alloy being Cu.

3. A copper alloy according to claim 1 or 2 wherein said Ni comprises between about 0.08 and about 1.0 weight percent, said Si comprises between about 0.02 and about 0.24 weight percent and said Zn comprises between about 0.1 and about 12.0 weight percent, respectively, of the alloy.

* * * * *

UNITED STATES PATENT OFFICE
CERTIFICATE OF CORRECTION

PATENT NO. : 4,366,117
DATED : December 28, 1982
INVENTOR(S) : Masahiro Tsuji

It is certified that error appears in the above-identified patent and that said Letters Patent are hereby corrected as shown below:

On Page 1, Line 73, after Assignee delete "NIKON"

On Page 1, Line 73, after Assignee insert --NIHON--

Signed and Sealed this

Sixth Day of September 1983

[SEAL]

Attest:

GERALD J. MOSSINGHOFF

Attesting Officer     Commissioner of Patents and Trademarks